(12) United States Patent
Green et al.

(10) Patent No.: US 7,411,414 B1
(45) Date of Patent: Aug. 12, 2008

(54) SINGLE-ENDED OUTPUT DRIVER BUFFER

(75) Inventors: Nathan Robert Green, Beaverton, OR (US); Loren L. McLaury, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/877,434

(22) Filed: Oct. 23, 2007

(51) Int. Cl.
*H03K 17/16* (2006.01)
*H03K 19/003* (2006.01)

(52) U.S. Cl. .............................. 326/27; 326/26; 326/30

(58) Field of Classification Search .................. None
See application file for complete search history.

(56) References Cited

U.S. PATENT DOCUMENTS

2003/0141894 A1 * 7/2003 Gonzalez ..................... 326/26

* cited by examiner

*Primary Examiner*—Anh Q Tran
(74) *Attorney, Agent, or Firm*—MacPherson Kwok Chen & Heid LLP; Brent A. Folsom

(57) ABSTRACT

Circuits and related methods are provided for buffering reference voltages from noise associated with output driver transistors. In one example, an output driver buffer circuit includes an output driver transistor adapted to adjust an output voltage of an output pad. The circuit also includes a pre-driver circuit connected to a gate of the output driver transistor. The pre-driver circuit is adapted to receive a reference voltage to control the output driver transistor. The pre-driver circuit includes a precharged capacitor, a first switch adapted to connect the capacitor to the gate, and a second switch adapted to connect the reference voltage to the gate. The second switch is adapted to operate following a time period after the capacitor is connected to the gate. The capacitor is adapted to buffer noise associated with the output driver transistor during the time period.

20 Claims, 15 Drawing Sheets

SINGLE-ENDED OUTPUT DRIVER BUFFER

TECHNICAL FIELD

Generally relates to driver circuitry and more specifically to providing reference voltages to output driver circuits.

BACKGROUND

Single-ended output driver circuits are often used to provide output signals at output pads of electronic devices. In this regard, output driver circuits typically includes drive transistors connected to output pads. Analog reference voltages applied to the gates of the drive transistors can facilitate precise control of the current delivered by the drive transistors and can be used to maintain drive strength (e.g., a constant 8 mA current drive) or adjust slew rates (e.g., faster or slower) of the drive transistors. These reference voltages are typically generated for distribution to a large group of output driver circuits.

Unfortunately, as the drive transistors switch to provide different voltages at the output pads, large amounts of noise can couple onto the gates of the drive transistors. This noise can disturb the global reference voltages to the point where they provide no control benefit to the drive transistors, or can even cause the driver transistors to malfunction.

One approach to reducing the effects of this noise involves the use of buffers such as source-follower amplifier stages or unity-gain buffers connected between the reference voltages and the driver transistors. These buffers typically consume a constant DC current (e.g., between approximately 200 μA and 2 mA per output driver), regardless of whether or not the driver transistors are switching. However, for implementations with large numbers of output drivers, the output buffers can significantly increase the current consumption of the output driver circuitry.

In a second approach, switches and delay elements may be used with the buffers to reduce the power consumed by the output buffers. In this second approach, delay elements may be used to power down the buffers after a time period during which most of the noise associated with a switching driver transistor has settled. For example, such switching may occur approximately 4 ns after a driver transistor has switched on. Switches may be used to directly connect the reference voltage to the driver transistors following this time period.

Although this second approach may reduce DC current consumption by the buffers to a period of approximately 4 ns (e.g., consuming approximately 1 mA to 3 mA depending on drive strength), additional layout area is required to implement the additional switches and delay elements. This can significantly increase the size of the output driver circuitry. For example, in one implementation, the output buffers may comprise approximately 232 square microns, and the switches and delay elements may comprise an additional approximately 950 square microns.

Accordingly, there is a need for an improved output driver circuit to buffer reference voltages provided to driver transistors that does not consume excessive current. In addition, there is also a need for an output driver circuit that performs such buffering without requiring a large chip area for implementation.

SUMMARY

In accordance with one embodiment of the present invention, an output driver buffer circuit includes a first output driver transistor adapted to adjust an output voltage of an output pad; and a first pre-driver circuit connected to a gate of the first output driver transistor and adapted to receive a first reference voltage to control the first output driver transistor, wherein the first pre-driver circuit comprises: a first capacitor adapted to be precharged to a first voltage, a first switch adapted to connect the first capacitor to the gate of the first output driver transistor, and a second switch adapted to connect the first reference voltage to the gate of the first output driver transistor following a first time period after the first capacitor is connected to the gate of the first output driver transistor, wherein the first capacitor is adapted to buffer noise associated with the first output driver transistor during the first time period.

In accordance with another embodiment of the present invention, a method of adjusting an output voltage of an output pad includes receiving a data signal; precharging a first capacitor to a first voltage; in response to the data signal transitioning from a first value to a second value, connecting the first capacitor to a gate of a first output driver transistor connected to the output pad; and connecting a first reference voltage to the gate of the first output driver transistor following a first time period after the first capacitor is connected to the gate of the first output driver transistor, wherein the first capacitor is adapted to buffer noise associated with the first output driver transistor during the first time period.

In accordance with another embodiment of the present invention, an output driver buffer circuit includes a first means for adjusting an output voltage of an output pad; a first means for buffering noise associated with the first adjusting means; a first means for connecting the first buffering means to the first adjusting means; and a first means for connecting a first reference voltage to the first adjusting means following a first time period after the first buffering means is connected to the first adjusting means.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 2, FIG. 2A and FIG. 2B illustrates a circuit diagram of a buffer system in accordance with an embodiment of the invention.

FIG. 4, FIG. 4A, FIG. 4B and FIG. 4C illustrates a data timer circuit in accordance with an embodiment of the invention.

FIG. 5, FIG. 5A and FIG. 5B illustrates a pull-up pre-driver circuit in accordance with an embodiment of the invention.

FIG. 6, FIG. 6A and FIG. 6B illustrates a pull-down pre-driver circuit in accordance with an embodiment of the invention.

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
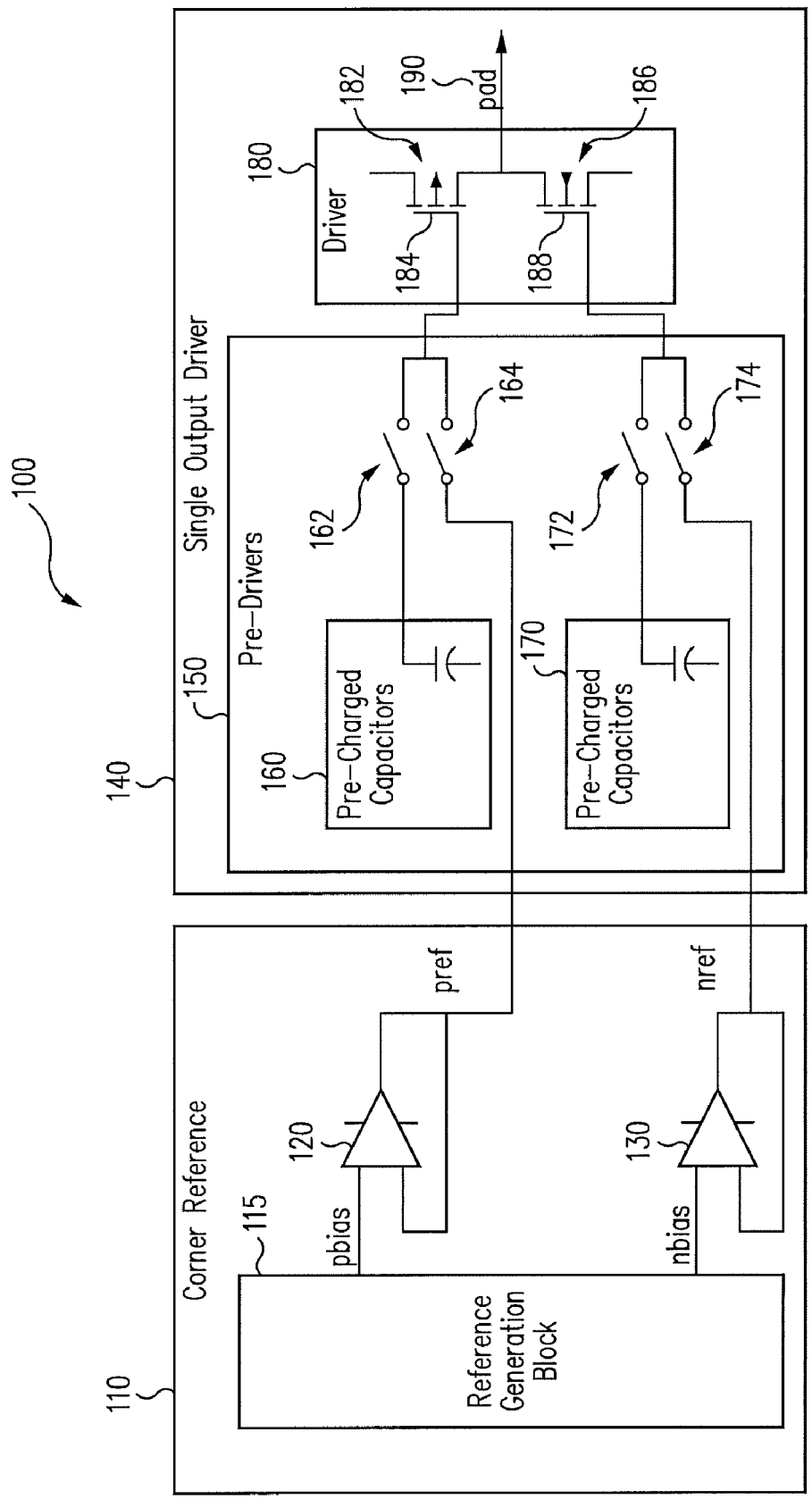
FIG. 1 illustrates a block diagram of a buffer system in accordance with an embodiment of the invention.

FIG. 1 illustrates a block diagram of a buffer system 100 in accordance with an embodiment of the invention. Buffer system 100 may be implemented as part of any appropriate device having single-ended output drivers. For example, in various embodiments, buffer system 100 may be included as part of the input/output (I/O) circuitry of an integrated circuit such as a programmable logic device (PLD) (e.g., such as a field programmable gate array (FPGA)), an application-specific integrated circuit (ASIC) or generic circuit, a peripheral component interconnect (PCI) compatible device, a low voltage CMOS (LVCMOS) device, or other types of devices.

As shown in FIG. 1, buffer system 100 includes a reference block 110 and an output driver block 140. Reference block 110 includes a reference generation block 115 that provides bias signals pbias and nbias to amplifiers 120 and 130. Using the bias signals, amplifiers 120 and 130 provide reference voltages pref and nref to output driver block 140.

Output driver block 140 includes a pre-drivers block 150, a driver block 180, and an output pad 190. Pre-drivers block 150 includes capacitors 160 and 170, and switches 162, 164, 172, and 174. Driver block 180 includes transistors 182 and 186 having gates 184 and 188, respectively.

Capacitors 160 and 170 may be precharged (for example, to voltages approximately equal to a logic high voltage and ground, respectively) and selectively connected to gates 184 and 188 by switches 162 and 172, respectively. In addition, reference voltages pref and nref, may be selectively connected to gates 184 and 188 of transistors 182 and 186 by switches 164 and 174, respectively.

Transistor 182 may be used to pull output pad 190 up to a logic high voltage, and transistor 186 may be used to pull output pad 190 down to a logic low voltage. In this regard, reference voltage pref may be provided to gate 184 of transistor 182 to turn on transistor 182 in order to pull up output pad 190 to a logic high voltage, or reference voltage nref may be provided to gate 188 of transistor 186 to turn on transistor 186 in order to pull down output pad 190 to a logic low voltage, depending on the desired output voltage of output pad 190.

Through the operation of switches 162, 164, 172, and 174, capacitors 160 and 170 can be used to buffer reference voltages pref and nref from noise disturbances caused by transistors 182 and 186 as output pad 190 transitions between low and high values corresponding, for example, to logic low and logic high voltages, respectively. For example, if output pad 190 is to be transitioned from a logic low voltage to a logic high voltage, transistor 184 may be turned on and capacitor 160 may be connected to gate 184 through switch 162 while switch 164 remains open for a brief time period. During this time period while switch 162 is closed and switch 164 is open, noise caused by the turning on of transistor 182 may be filtered by capacitor 160. Following the time period, switch 164 may be closed to connect reference voltage pref to gate 184 with little or no noise disturbance to reference voltage pref.

Similarly, if output pad 190 is to be transitioned from a logic high voltage to a logic low voltage, transistor 186 may be turned on and capacitor 170 may be connected to gate 188 through switch 172 while switch 174 remains open for a brief time period. During this time period while switch 172 is closed and switch 174 is open, noise caused by the turning on of transistor 186 may be filtered by capacitor 170. Following the time period, switch 174 may be closed to connect reference voltage nref to gate 188 with little or no noise disturbance to reference voltage nref.

Advantageously, each of capacitors 160 and 170 may consume very little current (for example, approximately 200-300 µA for a period of approximately 500-600 ps for each time output pad 190 toggles) and do not require large chip area to implement. As a result, noise associated with transistors 180 and 188 can be buffered with little impact on the power and chip area consumed by buffer system 100.

Figure 2A:
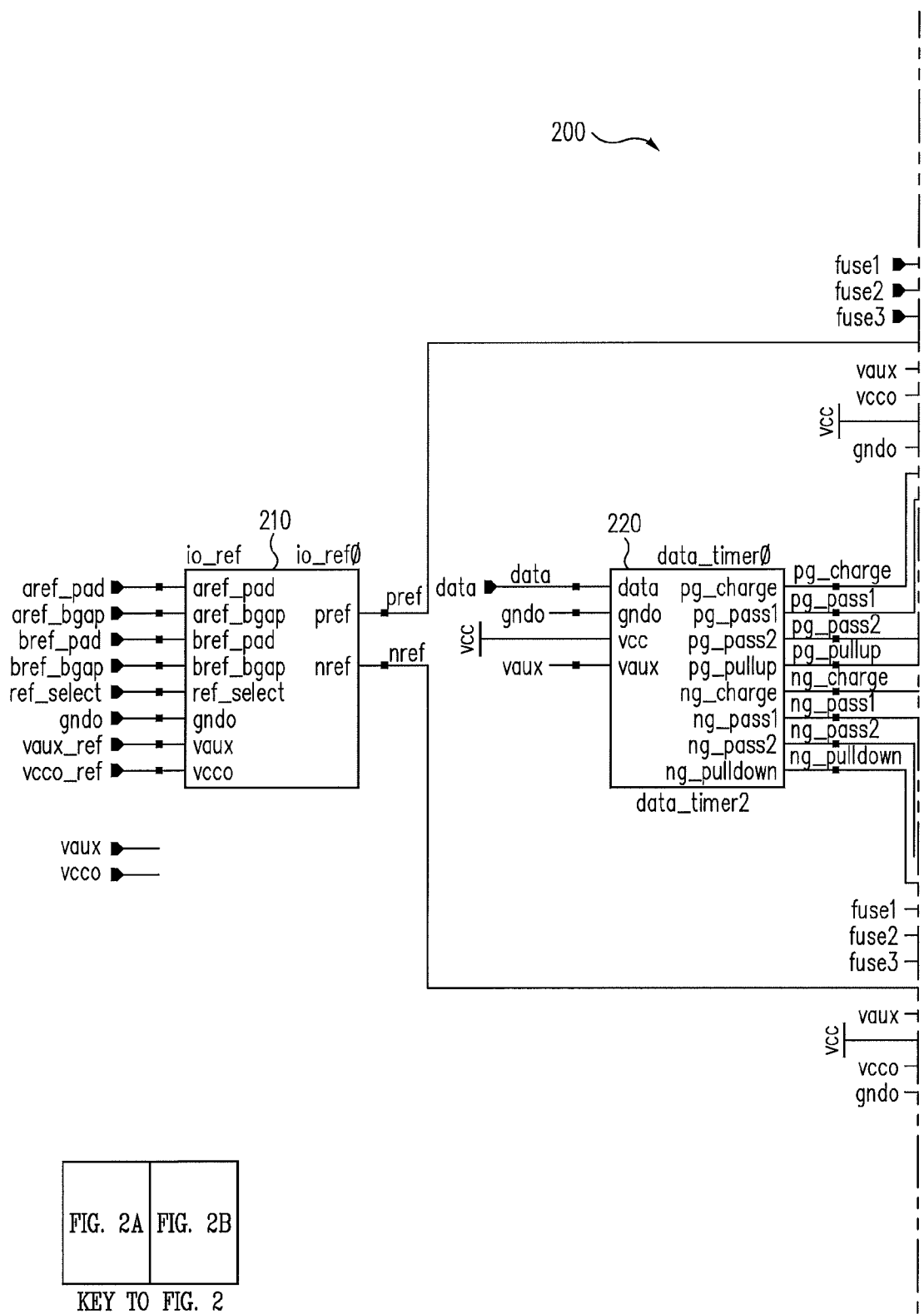
Figure 2B:
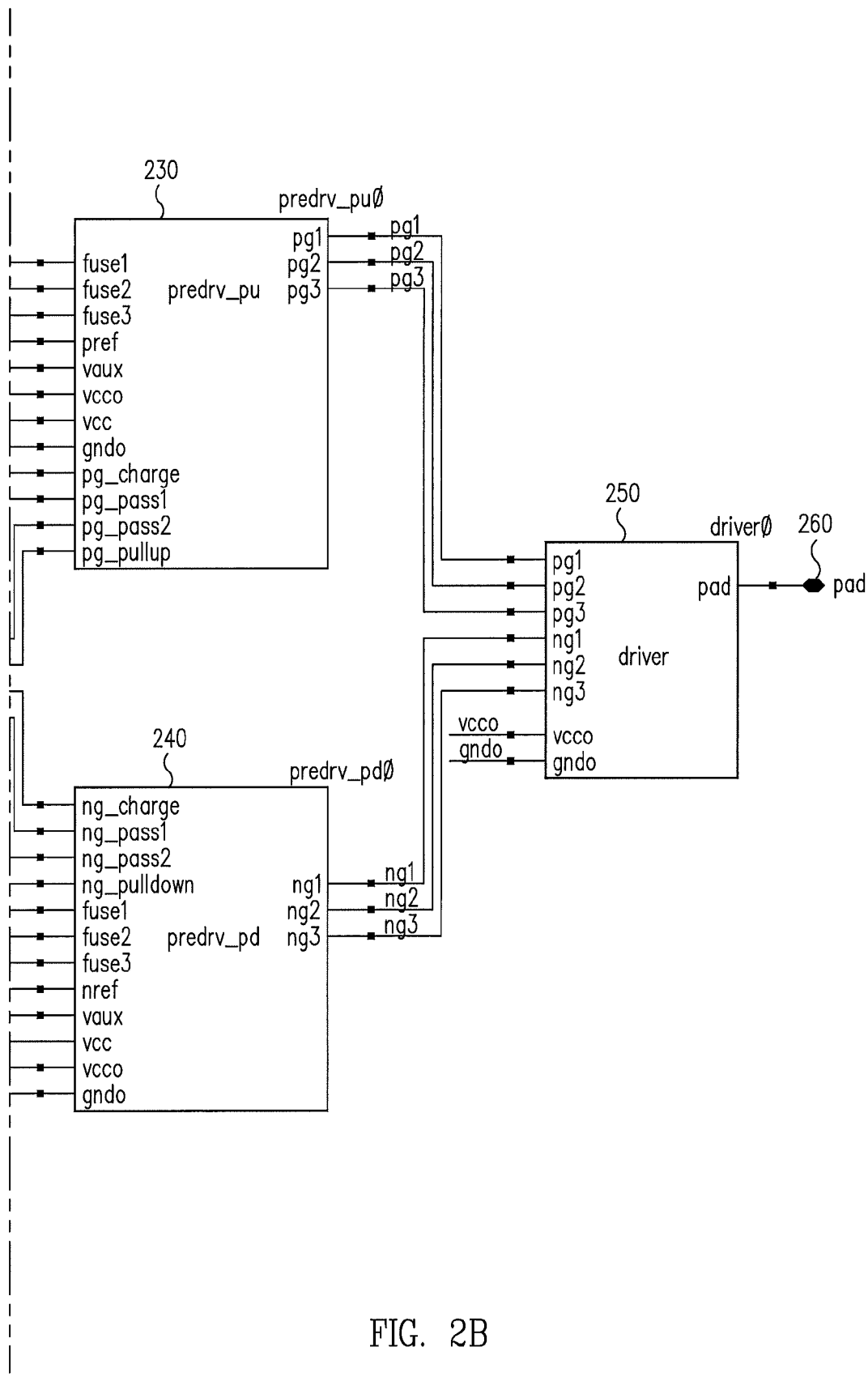

FIG. 2 illustrates a circuit diagram of a buffer system 200 in accordance with an embodiment of the invention. Buffer system 200 may be used, for example, to implement buffer system 100 of FIG. 1 previously described herein. As shown in FIG. 2, buffer system 200 includes a reference generator 210, a data timer 220, a pull-up pre-driver 230, a pull-down pre-driver 240, an output driver 250, and an output pad 260.

Reference generator 210 provides reference voltages pref and nref to pull-up pre-driver 230 and pull-down pre-driver 240, respectively. In this regard, reference generator 210 may be used, for example, to implement reference block 110 of FIG. 1 previously described herein.

Data timer 220 receives a data signal (labeled "data") to be provided to output pad 260. The data signal may be received from any appropriate source. For example, in one embodiment where buffer system 200 is implemented as part of I/O circuitry of a PLD, the data signal may be provided by other portions of the PLD. In response to the data signal transitioning between low and high values (for example, corresponding to logic low and logic high voltages), data timer 220 provides a plurality of control signals (labeled "pg_charge," "pg_pass1," "upg_pass2," and "pg_pullup") to pull-up pre-driver 230, and also provides a plurality of control signals (labeled "ng_charge," "ng_ass1," "ng_pass2," and "ng_pull-down") to pull-down pre-driver 240.

Pull-up pre-driver 230 provides a plurality of control signals (labeled "pg1," "pg2," and "pg3") to output driver 250 which may be used to switch pull-up transistors (for example, PMOS transistors) of output driver 250. Similarly, pull-down pre-driver 240 provides a plurality of control signals (labeled "ng1," "ng2," and "ng3") to output driver 250 which may be used to switch pull-down transistors (for example, NMOS transistors) of output driver 250.

Figure 3:
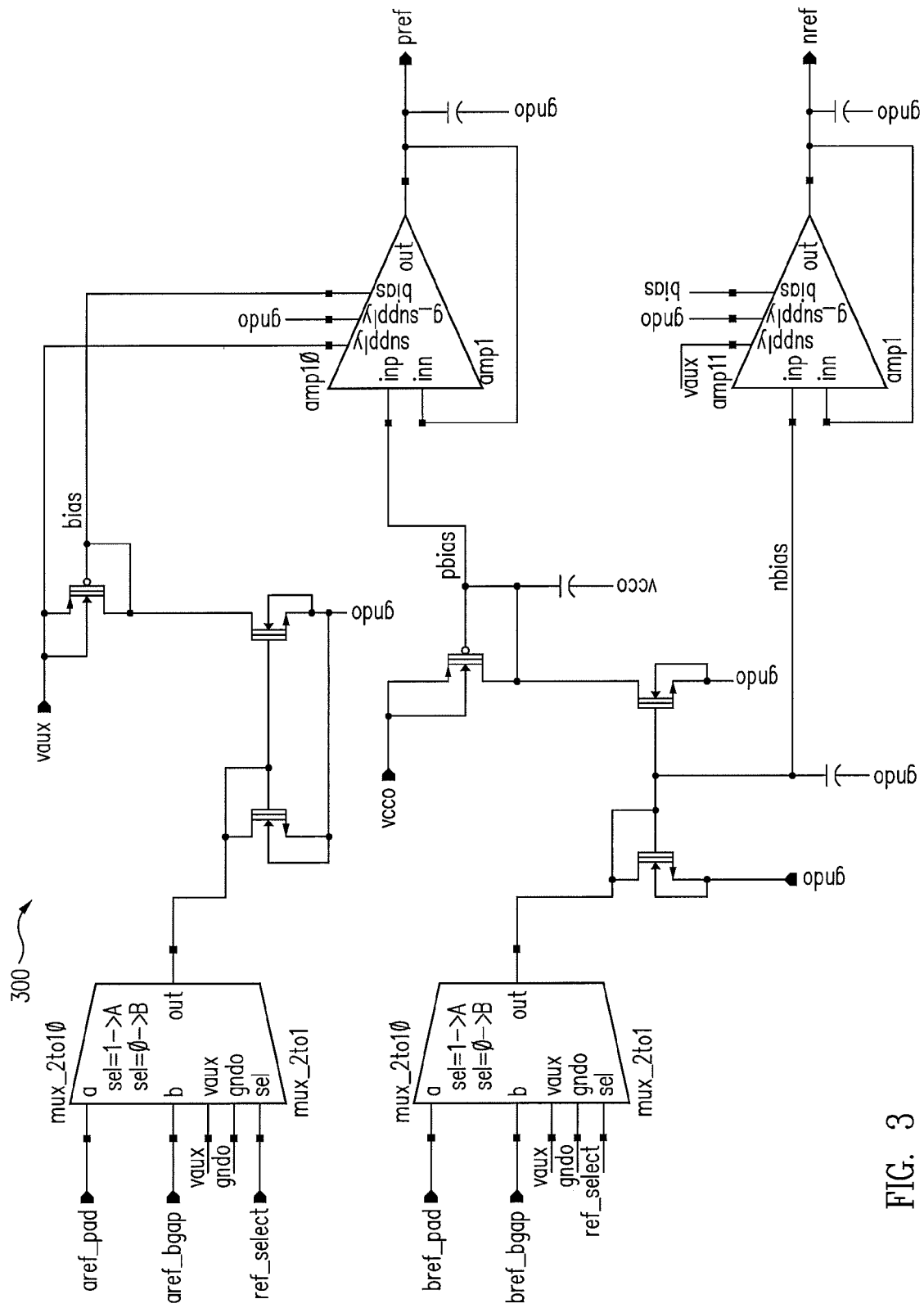
FIG. 3 illustrates a reference voltage generator circuit in accordance with an embodiment of the invention.

FIG. 3 illustrates a reference voltage generator circuit 300 in accordance with an embodiment of the invention. Voltage generator circuit 300 may be used, for example, to implement reference generator 210 of buffer system 200. As shown in FIG. 3, voltage generator circuit 300 provides various components that may be used to generate reference voltages pref and nref. In this regard, reference voltages pref and nref may be implemented as global reference voltages that are provided to one or more output driver circuits of a device including buffer system 100.

Figure 4A:
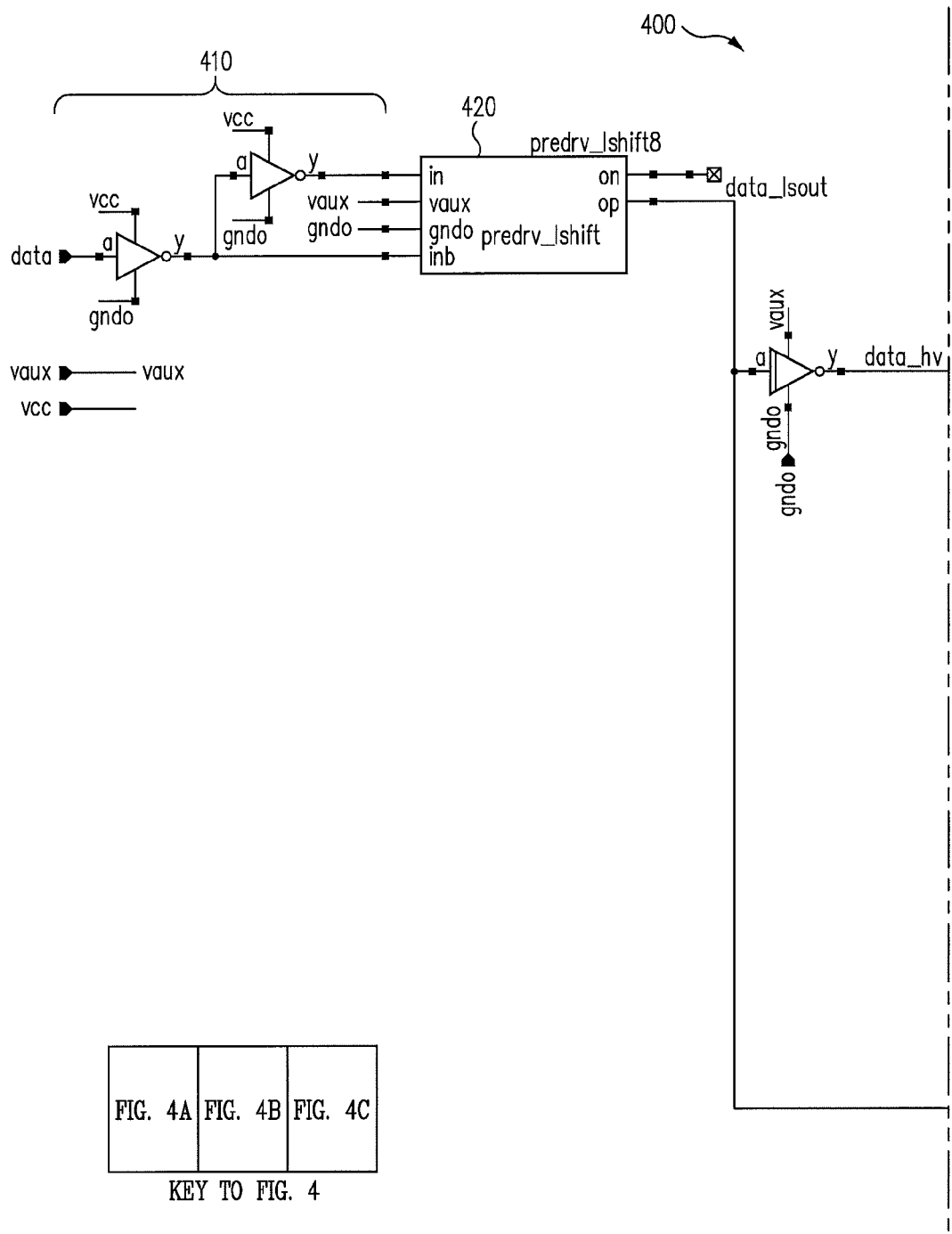
Figure 4B:
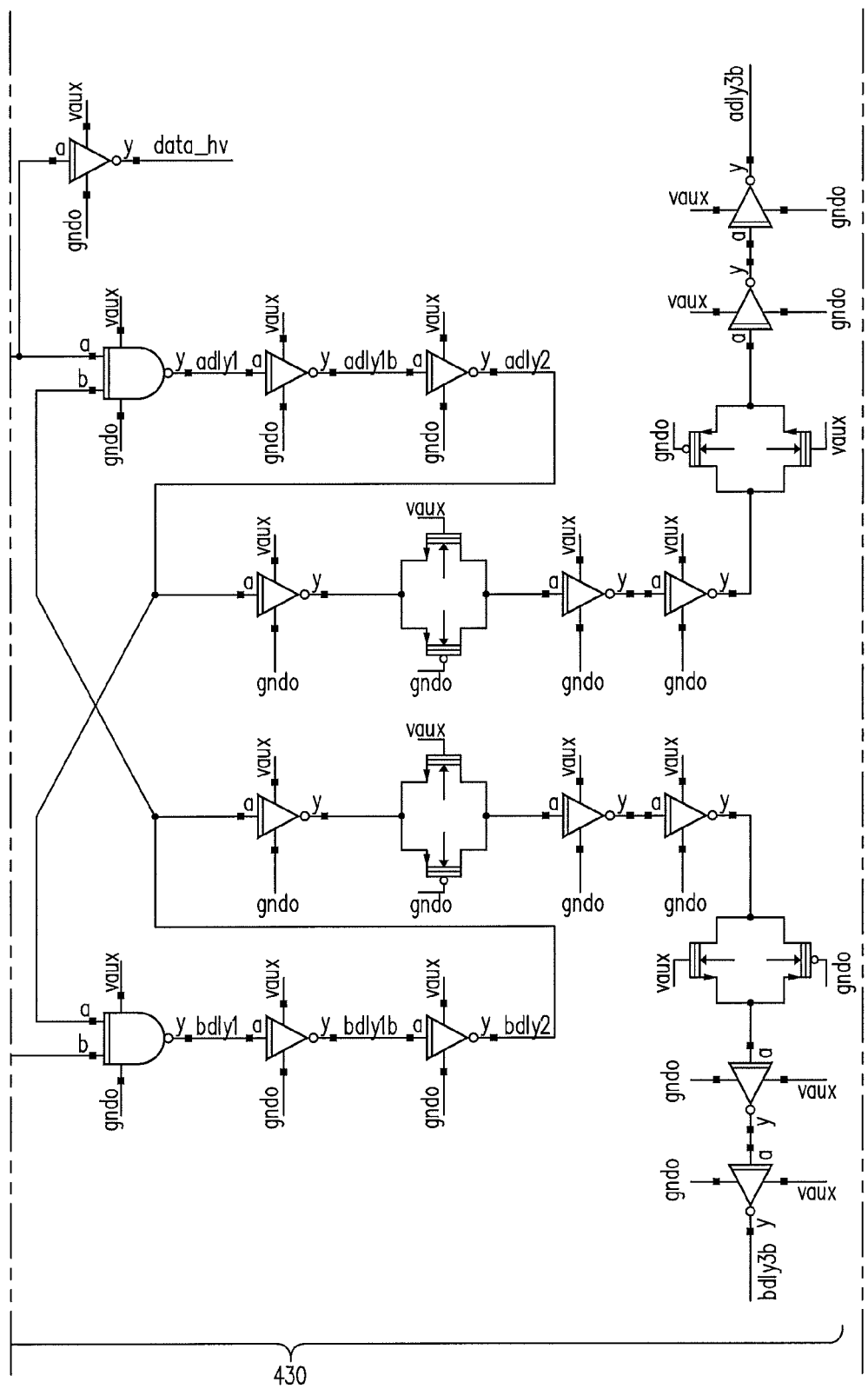
Figure 4C:
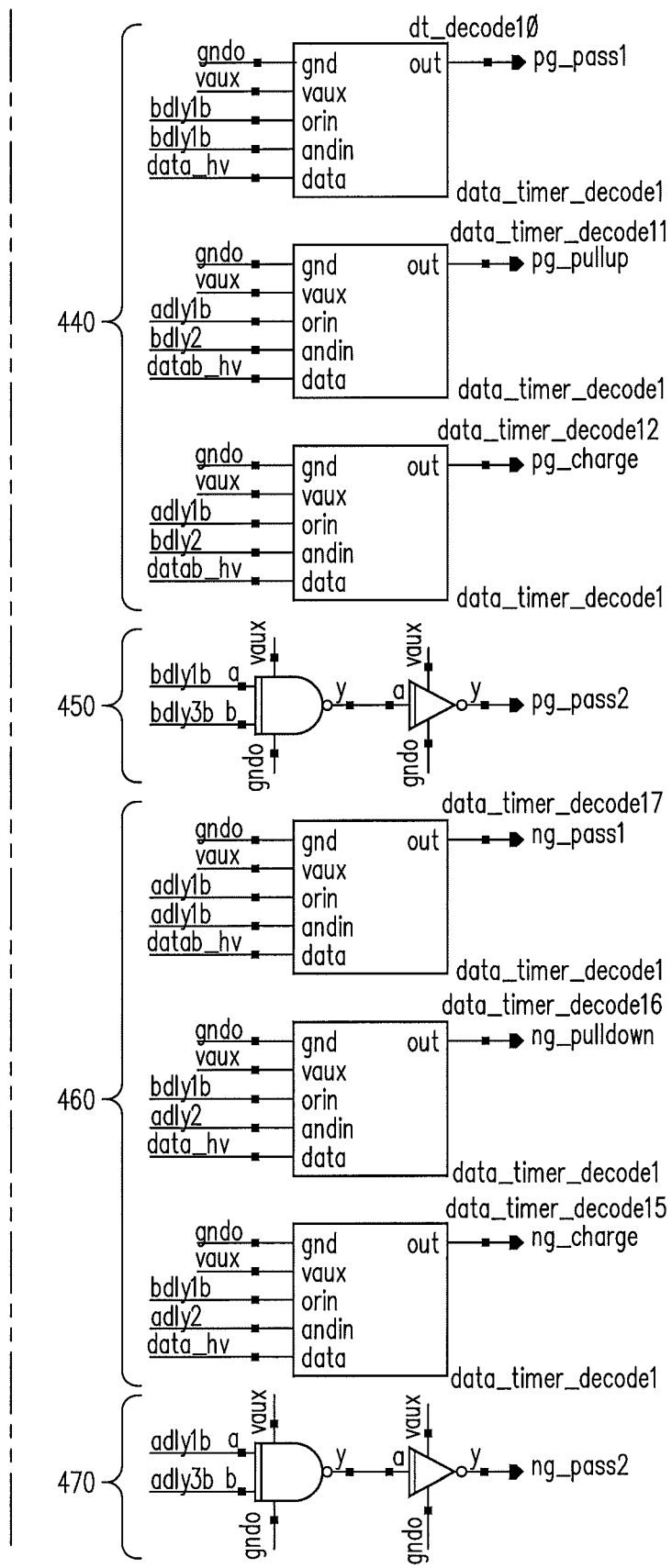

FIG. 4 illustrates a data timer circuit 400 in accordance with an embodiment of the invention. Data timer circuit 400 may be used, for example, to implement data timer 220 of buffer system 200. As shown in FIG. 4, data timer circuit 400 provides various components that may be used to generate control signals pg_charge, pg_pass1, pg_pass2, and pg_pullup to be provided to pull-up pre-driver 230, and also generate control signals ng_charge, ng_pass1, ng_pass2, and ng_pulldown to be provided to pull-down pre-driver 240.

In this regard, data timer circuit 400 includes logic 410 to receive the data signal previously described in FIG. 2. Logic 410 provides the data signal to a voltage level shifter 420 which in turn provides a voltage-shifted version of the data signal to a non-overlapping clock generator 430. Various signals generated by clock generator 430 in response to the data signal are provided to decoders 440 and 460, and logic 450 and 470 to generate control signals to be provided to pull-up pre-driver 230 and pull-down pre-driver 240.

Figure 5A:
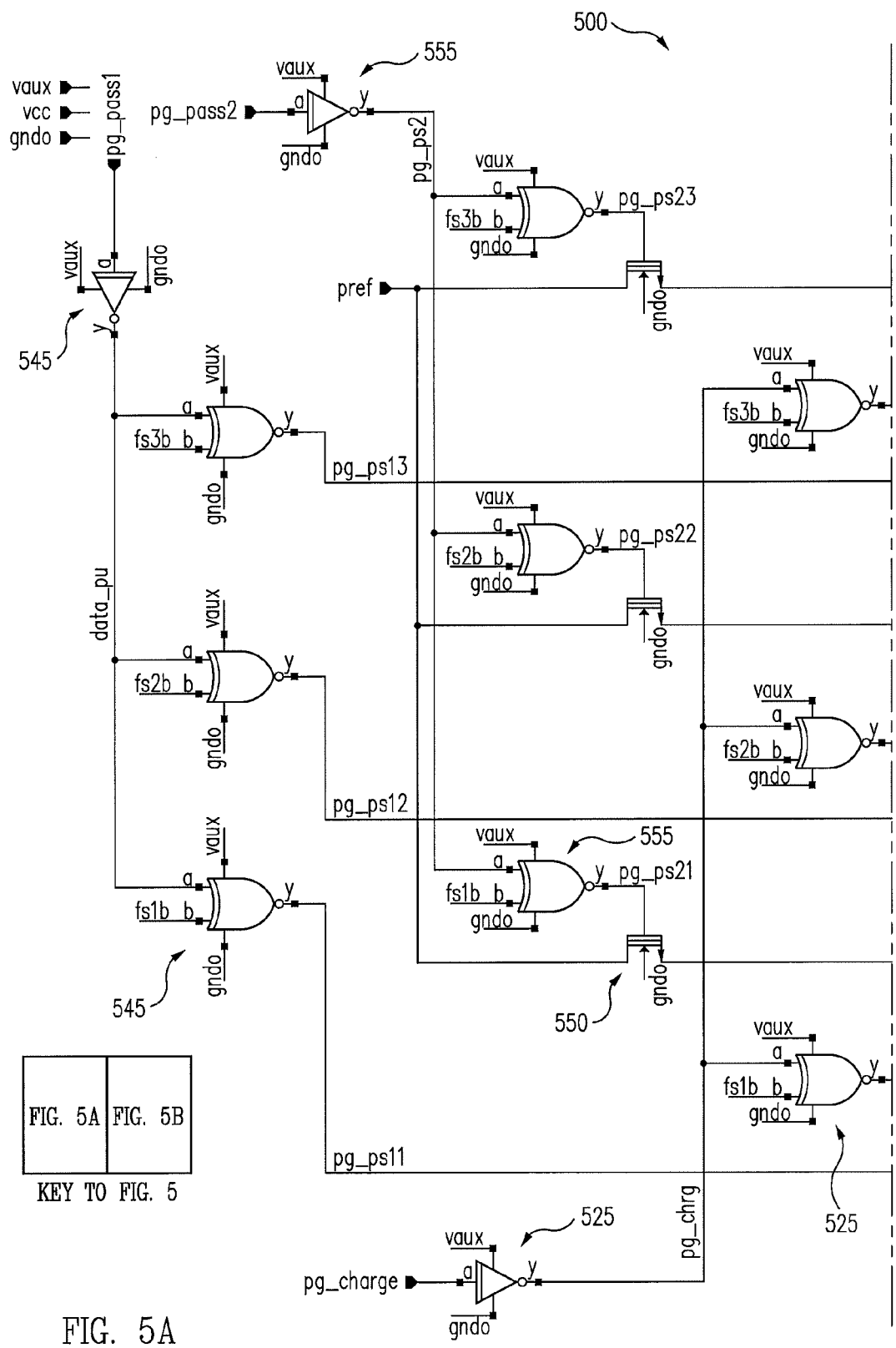
Figure 5B:
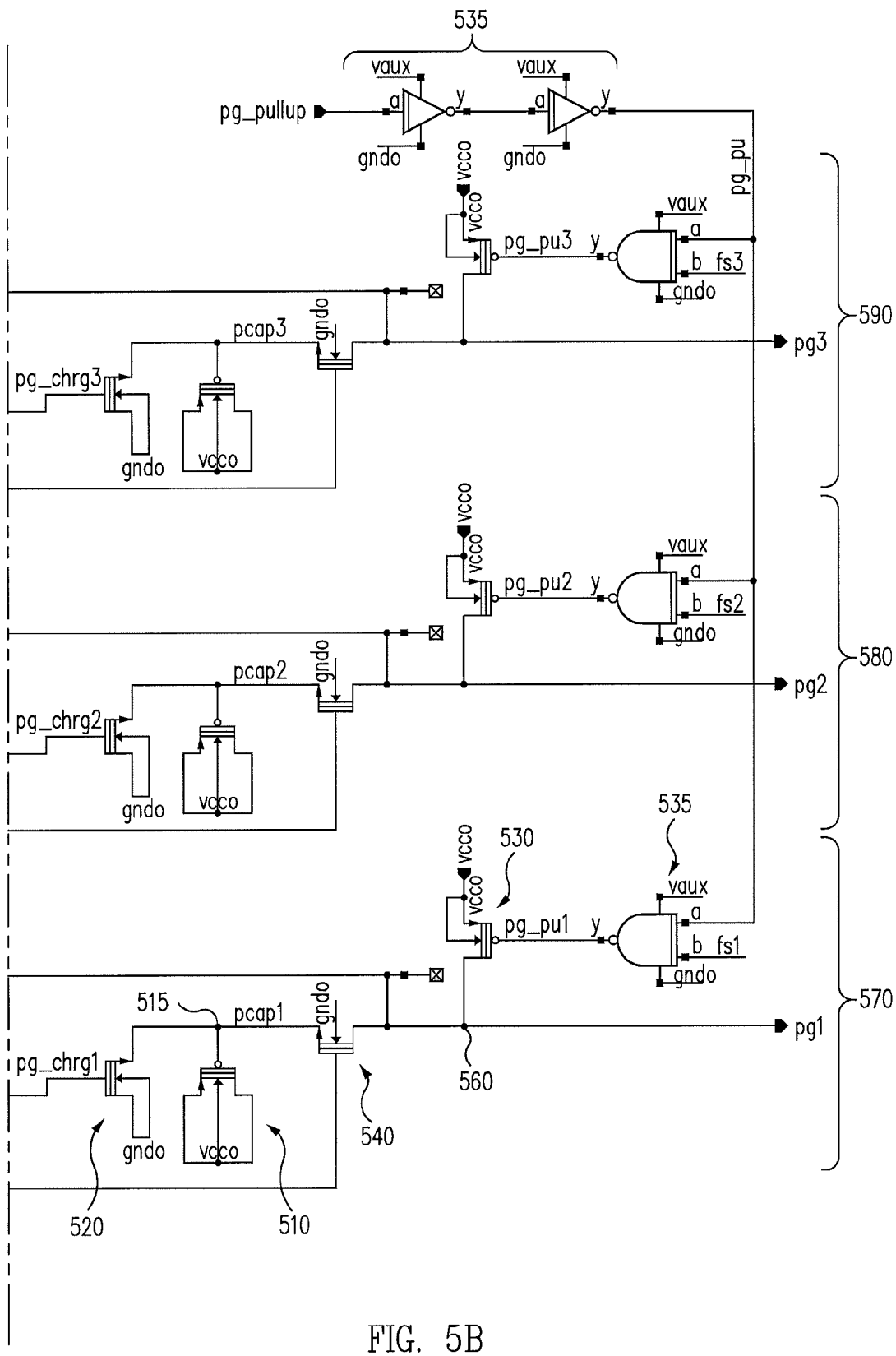

FIG. 5 illustrates a pull-up pre-driver circuit 500 in accordance with an embodiment of the invention. Pull-up pre-driver circuit 500 may be used, for example, to implement pull-up pre-driver 230 of buffer system 200. As shown in FIG. 5, pull-up pre-driver circuit 500 provides subcircuits 570, 580, and 590 that may be used to generate control signals pg1, pg2, and pg3, respectively, in response to control signals pg_charge, pg_pass1, pg_pass2, and pg_pullup. As also shown in FIG. 5, pull-up pre-driver circuit 500 receives reference voltage pref.

Subcircuit 570 includes a capacitor 510 which has been implemented in the illustrated embodiment by a transistor with its source, drain, and substrate connected together to a reference voltage VCCO. However, different implementations of capacitor 510 may be used in other embodiments. Capacitor 510 is connected to transistors 520 and 540 at a node 515. Node 515 may be precharged to a reference voltage, such as ground, through the operation of control signal pg_charge. In this regard, control signal pg_charge is provided to logic 525 which inverts the signal twice before providing it to a gate of transistor 520. When control signal pg_charge is set to a logic high voltage, transistor 520 will turn on. Because a drain of transistor 520 is connected to ground (labeled in FIG. 5 as "gndo"), node 515 will be pulled approximately to ground while transistor 520 is on.

Control signal pg1 may be set to a logic high voltage in response to control signal pg_pullup. As shown in FIG. 5, control signal pg_pullup is received by logic 535 which inverts the signal three times before providing it to a gate of a transistor 530 as signal pg_pu1. When control signal pg_pullup is set to a logic high voltage, signal pg_pu1 will be set to a logic low voltage causing transistor 530 to turn on. A source of transistor 530 is connected to reference voltage VCCO. Therefore, transistor 530 will operate to pull a node 560 up approximately to reference voltage VCCO while transistor 530 is on, causing control signal pg1 to provide a logic high voltage. When control signal pg_pullup is set to a logic low voltage, signal pg_pu1 will be set to a logic high voltage causing transistor 530 to turn off. While transistor 530 is off, it will no longer operate to pull up node 560.

Capacitor 510 and node 515 may be selectively connected to node 560 through the operation of control signal pg_pass1. As shown in FIG. 5, control signal pg_pass1 is received by logic 545 which inverts the signal twice before providing it to a gate of transistor 540. When control signal pg_pass1 is set to a logic low voltage, transistor 540 will remain turned off. As a result, capacitor 510 and node 515 will remain disconnected from node 560. When control signal pg_pass1 is set to a logic high voltage, transistor 540 will turn on to connect capacitor 510 and node 515 to node 560.

Reference voltage pref may be selectively connected to node 560 through the operation of control signal pg_pass2. As shown in FIG. 5, control signal pg_pass2 is received by logic 555 which inverts the signal twice before providing it to a gate of a transistor 550. When control signal pg_pass2 is set to a logic low voltage, transistor 550 will remain turned off. As a result, reference voltage pref will remain disconnected from node 560. When control signal pg_pass2 is set to a logic high voltage, transistor 550 will turn on to connect reference voltage pref to node 560.

It will be appreciated that the various components of subcircuits 580 and 590 illustrated in FIG. 5 may be operated in a similar manner to the above-described components of subcircuit 570 to provide control signals pg2 and pg3, respectively, in response to control signals pg_charge, pg_pass1, pg_pass2, and pg_pullup.

Figure 6A:
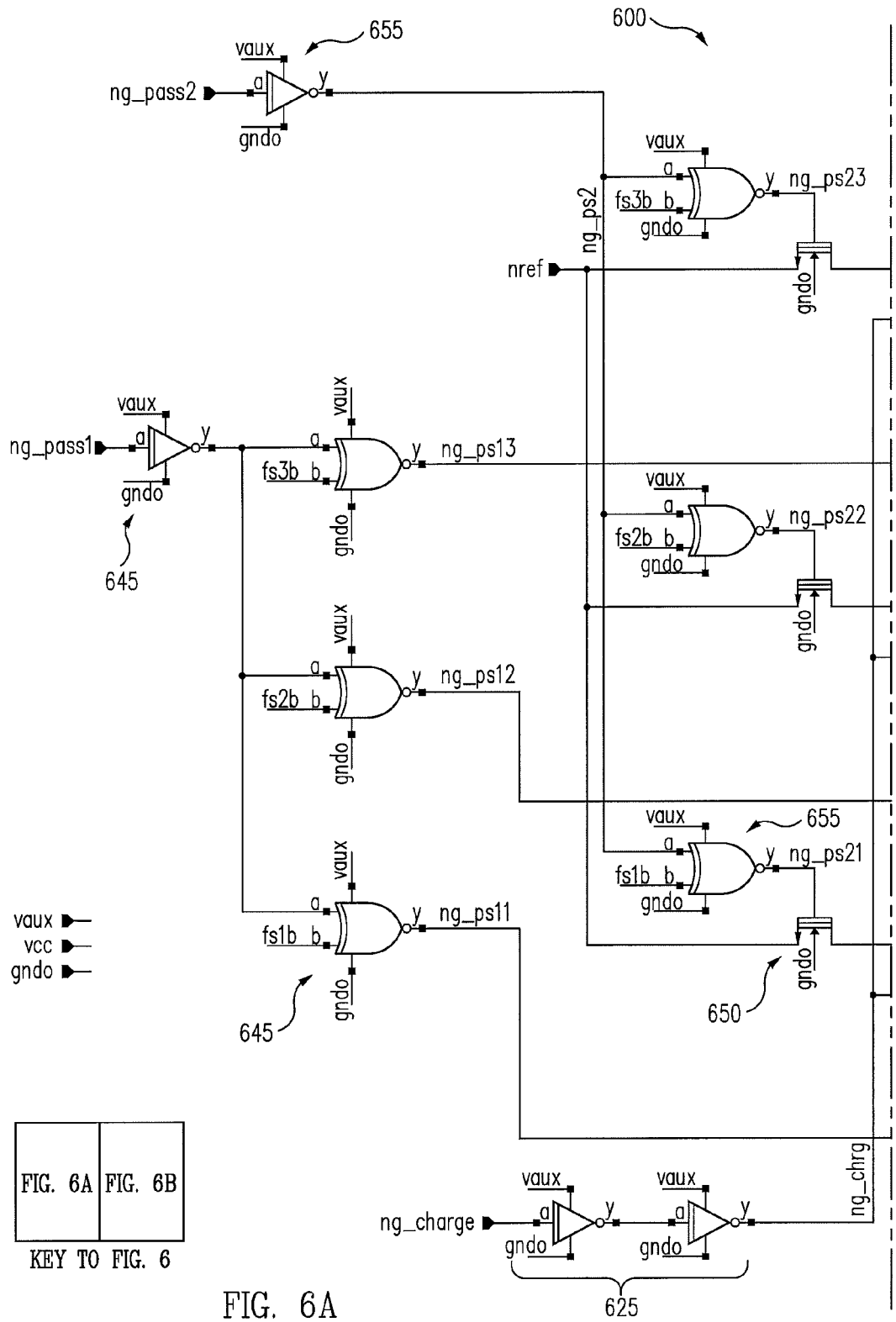
Figure 6B:
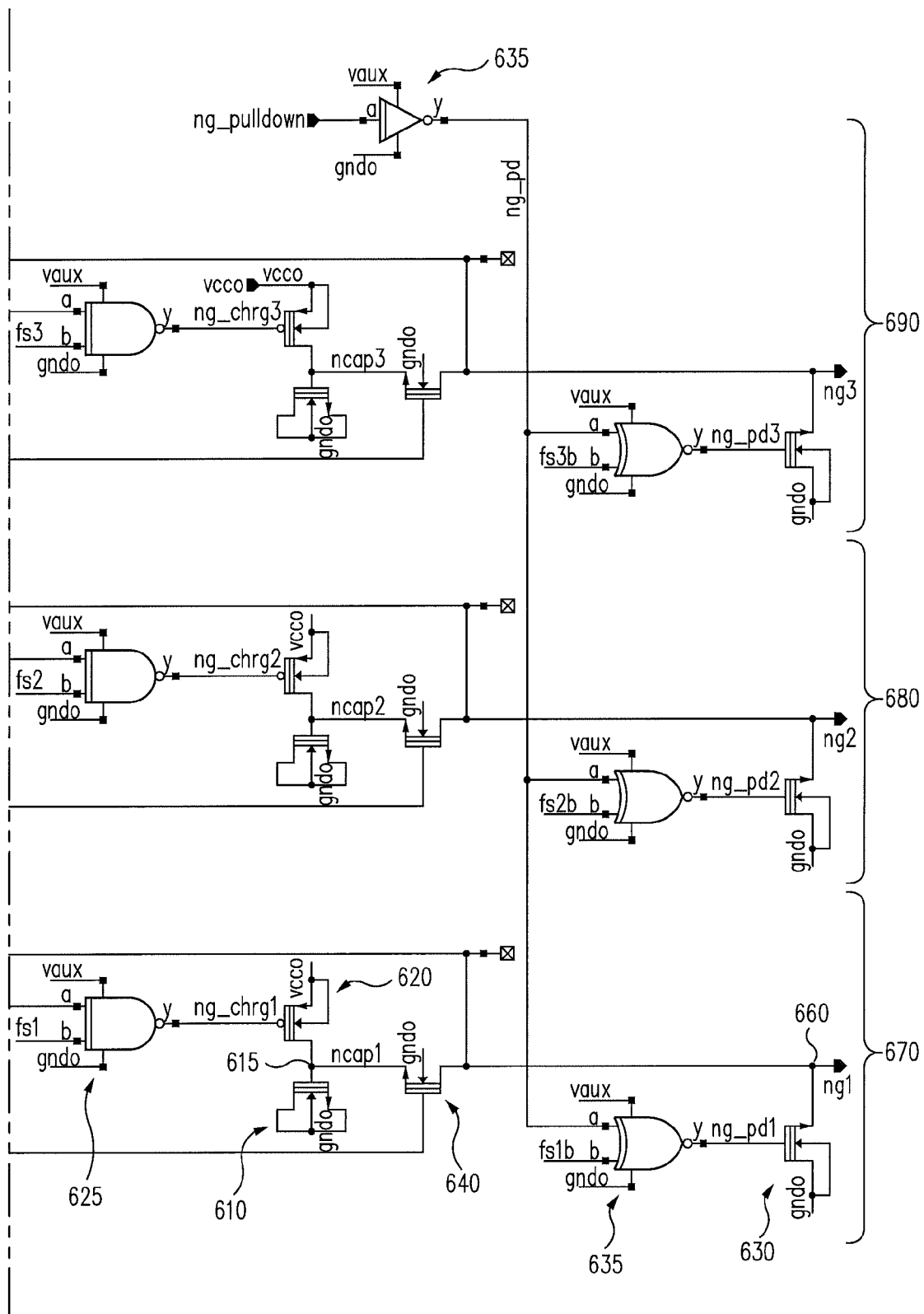

FIG. 6 illustrates a pull-down pre-driver circuit 600 in accordance with an embodiment of the invention. Pull-down pre-driver circuit 600 may be used, for example, to implement pull-down pre-driver 240 of buffer system 200. As shown in FIG. 6, pull-down pre-driver circuit 600 provides subcircuits 670, 680, and 690 that may be used to generate control signals ng1, ng2, and ng3, respectively, in response to control signals ng_charge, ng_pass1, ng_pass2, and ng_pulldown. As also shown in FIG. 6, pull-down pre-driver circuit 600 receives reference voltage nref.

Subcircuit 670 includes a capacitor 610 which has been implemented in the illustrated embodiment by a transistor with its source, drain, and substrate connected together to ground (labeled in FIG. 6 as "gndo"). However, different implementations of capacitor 610 may be used in other embodiments. Capacitor 610 is connected to transistors 620 and 640 at a node 615. Node 615 may be precharged to a reference voltage, such as a logic high voltage, through the operation of control signal ng_charge. In this regard, control signal ng_charge is provided to logic 625 which inverts the signal three times before providing it to a gate of transistor 620 as control signal ng_chrg1. When control signal ng_charge is set to a logic high voltage, control signal ng_chrg1 will be set to a logic low voltage causing transistor 620 to turn on. Because a source of transistor 620 is connected to reference voltage VCCO, node 615 will be pulled approximately to reference voltage VCCO while transistor 620 is on.

Control signal ng1 may be set to a logic low voltage in response to control signal ng_pulldown. As shown in FIG. 6, control signal ng_pulldown is received by logic 635 which inverts the signal twice before providing it to a gate of a transistor 630. When control signal ng_pulldown is set to a logic high voltage, transistor 630 will turn on. A drain of transistor 630 is connected to ground. Therefore, transistor 630 will operate to pull a node 660 down approximately to ground while transistor 630 is on, causing control signal ng1 to provide a logic low voltage. When control signal ng_pulldown is set to a logic low voltage, transistor 630 will turn off. While transistor 630 is off, it will no longer operate to pull down node 660.

Capacitor 610 and node 615 may be selectively connected to node 660 through the operation of control signal ng_pass1. As shown in FIG. 6, control signal ng_pass1 is received by logic 645 which inverts the signal twice before providing it to a gate of transistor 640. When control signal ng_pass1 is set to a logic low voltage, transistor 640 will remain turned off. As a result, capacitor 610 and node 615 will remain disconnected from node 660. When control signal ng_pass1 is set to a logic high voltage, transistor 640 will turn on to connect capacitor 610 and node 615 to node 660.

Reference voltage nref may be selectively connected to node 660 through the operation of control signal ng_pass2. As shown in FIG. 6, control signal ng_pass2 is received by logic 655 which inverts the signal twice before providing it to a gate of a transistor 650. When control signal ng_pass2 is set to a logic low voltage, transistor 650 will remain turned off. As a result, reference voltage nref will remain disconnected from node 660. When control signal ng_pass2 is set to a logic high voltage, transistor 650 will turn on to connect reference voltage nref to node 660.

It will be appreciated that the various components of sub-circuits 680 and 690 illustrated in FIG. 6 may be operated in a similar manner to the above-described components of sub-circuit 670 to provide control signals ng2 and ng3, respectively, in response to control signals ng_charge, ng_pass1, ng_pass2, and ng_pulldown.

Figure 7:
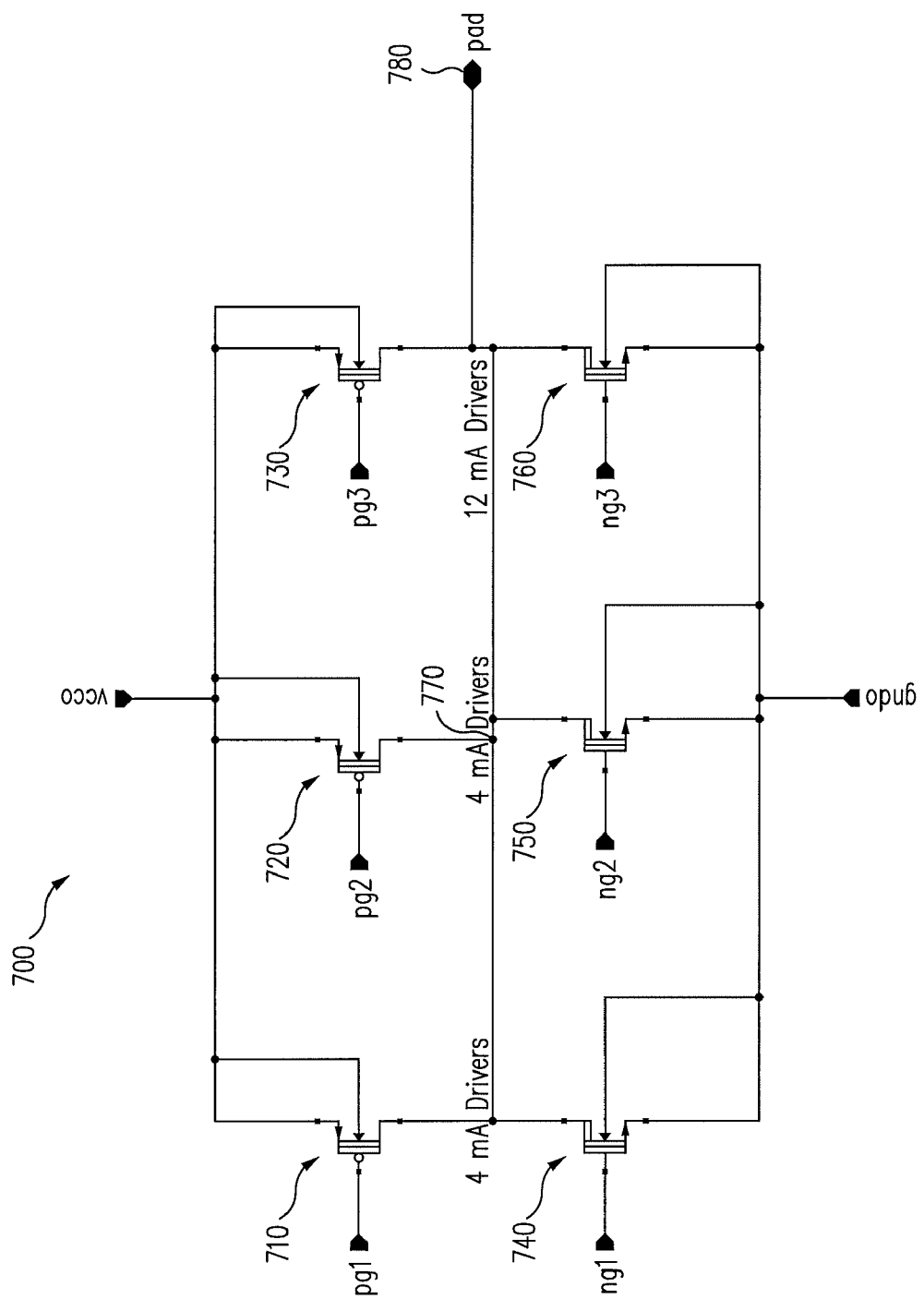
FIG. 7 illustrates an output pad driver circuit in accordance with an embodiment of the invention.

FIG. 7 illustrates an output pad driver circuit 700 in accordance with an embodiment of the invention. Output pad driver circuit 700 may be used, for example, to implement output driver 250 of buffer system 200.

As shown in FIG. 7, output pad driver circuit 700 includes pull-up transistors 710, 720, and 730 that receive control signals pg1, pg2, and pg3, respectively. Output pad driver circuit 700 also includes pull-down transistors 740, 750, and 760 that receive control signals ng1, ng2, and ng3, respectively. In addition, output pad driver circuit 700 includes an output pad 780 that may be used to implement, for example, output pad 260 of buffer system 200.

Each of pull-up transistors 710, 720, and 730 have a source connected to reference voltage VCCO and a drain connected to a node 770. Each of pull-down transistors 740, 750, and 760 have a source connected to ground gndo and a drain connected to node 770. As shown, output pad 780 is also connected to node 770.

The voltage of output pad 780 may be switched between a logic high voltage and a logic low voltage by pull-up transistors 710, 720, and 730 and pull-down transistors 740, 750, and 760 in response to control signals pg1, pg2, pg3, ng1, ng2, and ng3. In this regard, when control signals pg1, pg2, pg3 are set to logic low voltages and control signals ng1, ng2, ng3 are set to logic low voltages, pull-up transistors 710, 720, and 730 will turn on and pull-down transistors 740, 750, and 760 will turn off. As a result, pull-up transistors 710, 720, and 730 will operate to pull the voltage of output pad 780 up approximately to reference voltage VCCO.

When control signals pg1, pg2, pg3 are set to logic high voltages and control signals ng1, ng2, ng3 are set to logic high voltages, pull-up transistors 710, 720, and 730 will turn off and pull-down transistors 740, 750, and 760 will turn on. As a result, pull-down transistors 740, 750, and 760 will operate to pull the voltage of output pad 780 down approximately to ground.

Figure 8:
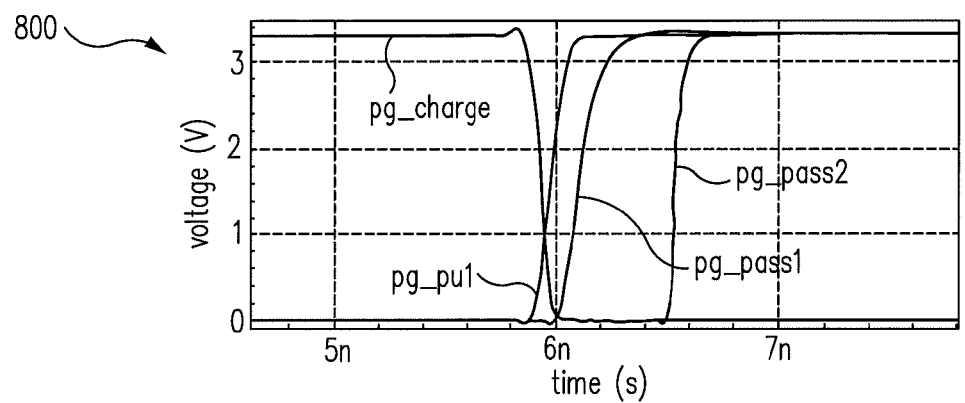
FIGS. 8-10 illustrate waveform plots showing various signals and voltages associated with a low-to-high voltage transition at an output pad in accordance with an embodiment of the invention.
Figure 9:
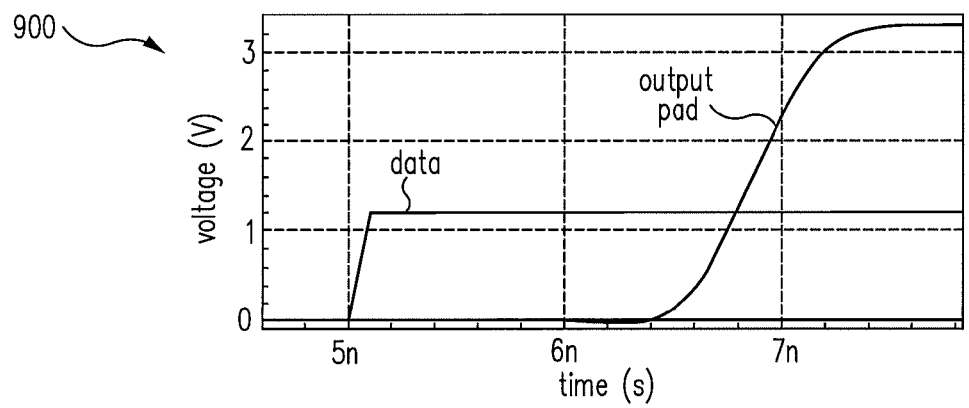
Figure 10:
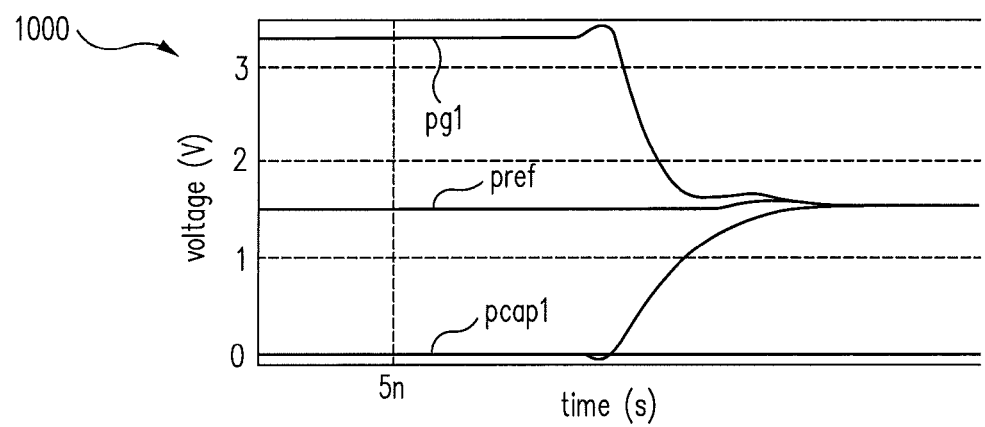

The operation of various circuits described herein can be further understood with regard to the waveform plots shown in FIGS. 8-14. In this regard, FIGS. 8-10 illustrate waveform plots 800, 900, and 1000 showing various signals and voltages associated with a low-to-high voltage transition at output pad 280 in accordance with an embodiment of the invention. For example, FIG. 8 illustrates a waveform plot 800 showing control signals pg_charge, pg_pu1, pg_pass1, and pg_pass2 used to implement a low-to-high voltage transition at output pad 280. As previously discussed, data timer circuit 400 provides control signals pg_charge, pg_pullup, pg_pass1, and pg_pass2 to pull-up pre-driver circuit 500 which may be used to implement pull-up pre-driver 230. As also previously discussed, logic 535 of pull-up pre-driver circuit 500 inverts control signal pg_pullup to provide control signal pg_pu1.

FIG. 9 illustrates a waveform plot 900 showing the data signal provided to data timer circuit 400 and a low-to-high voltage transition of output pad 280. FIG. 10 illustrates a waveform plot 1000 showing voltages of control signal pg1, reference voltage pref, and node 515 (labeled as "pcap1") also during the low-to-high voltage transition of output pad 280.

Each of control signals pg_charge, pg_pu1, pg_pass1, and pg_pass2 are shown in FIG. 8 transitioning between a logic low voltage of approximately 0V and a logic high voltage of approximately 3.25V. These transitions may be performed by data timer circuit 400 (and also by logic 535 in the case of control signal pg_pu1) in response to the data signal provided to data timer circuit 400 transitioning from a logic low voltage to a logic high voltage.

For example, as shown in FIG. 9, the data signal may transition from a logic low voltage to a logic high voltage approximately at time 5 ns. Prior to the low-to-high transition of the data signal, control signal pg_charge is initially set to a logic high voltage as shown in FIG. 8. During this time (e.g., prior to the low-to-high transition of the data signal), transistor 520 of FIG. 5 will be turned on by control signal pg_charge. As a result, node 515 (e.g., pcap1) will be pulled approximately to ground as shown in FIG. 10 to precharge capacitor 510.

Also during this time, control signal pg_pu1 is set to a logic low voltage which causes transistor 530 of FIG. 5 to turn on. As a result, control signal pg1 provided by node 560 is pulled up to a logic high voltage of approximately 3.25V as shown in FIG. 10. Control signals pg_pass1 and pg_pass2 are also set to logic low voltages during this time which cause transistors 540 and 550, respectively of pull-up pre-driver circuit 500 to turn off. As a result, node 515, capacitor 510, and reference voltage pref will be disconnected from node 560 of pull-up pre-driver circuit 500. Also during this time, reference voltage pref exhibits a voltage of approximately 1.5V as shown in FIG. 10.

Following the transition of the data signal from a logic low voltage to a logic high voltage as shown in FIG. 9, control signals pg_charge, pg_pu1, pg_pass1, and pg_pass2 are switched by data timer circuit 400 and logic 535. Initially, control signal pg_charge transitions from a logic high voltage to a logic low voltage, and control signal pg_pu1 transitions from a logic low voltage to a logic high voltage. As a result, transistor 520 will turn off and no longer operate to precharge node 515 and capacitor 510 approximately to ground. In addition, transistor 530 will turn off and no longer operate to pull up node 560 and control signal pg1 to a logic high voltage.

Following the switching of control signals pg_charge and pg_pu1, data timer circuit 400 switches control signal pg_pass1 from a logic low voltage to a logic high voltage. As a result, transistor 540 will turn on and connect node 515 and capacitor 510 to node 560.

Following a time period (for example, approximately 200 ps) after the switching of control signal pg_pass1, data timer circuit 400 switches control signal pg_pass2 from a logic low voltage to a logic high voltage. As a result, transistor 550 will turn on and connect reference voltage pref to node 560.

The effects of the above-described switching of control signals pg_charge, pg_pu1, pg_pass1, and pg_pass2 are shown in waveform plots 900 and 1000. For example, after the precharging of capacitor 510 and node 515 is interrupted (e.g., in response to control signal pg_charge turning off transistor 520), and node 560 is no longer pulled to a logic high voltage (e.g., in response to control signal pg_pu1 turning off transistor 530), charge will transfer from capacitor 510 to node 560 until the voltage of node 560 equalizes. This causes the voltage at node 515 (e.g., pcap1) to rise and also causes the voltage at node 560 (e.g., control signal pg1) to fall as shown in FIG. 10. Capacitor 510 may be sized so that nodes 515 and 560 settle to a voltage approximately equal to reference voltage pref as shown in FIG. 10. In response to the change in voltage of control signal pg1, transistor 710 of output pad driver circuit 700 will turn on, causing the voltage of output pad 280 to rise as shown in FIG. 9.

It will be appreciated that prior to the switching of control signal pg_pass2 from a logic low voltage to a logic high voltage, reference voltage pref remains disconnected from node 560. In this regard, noise associated with the switching on of transistor 710 can be largely buffered by capacitor 510. As a result, when reference voltage pref is later connected to the gate of transistor 710 (e.g., through node 560 and control signal pg1), reference voltage pref is disturbed very little as shown in FIG. 10.

It will be appreciated that subcircuits 580 and 590 of pull-up pre-driver circuit 500 may be operated in a similar manner as described above in order to buffer reference voltage pref from noise disturbances associated with transistors 720 and 730, respectively.

Figure 11:
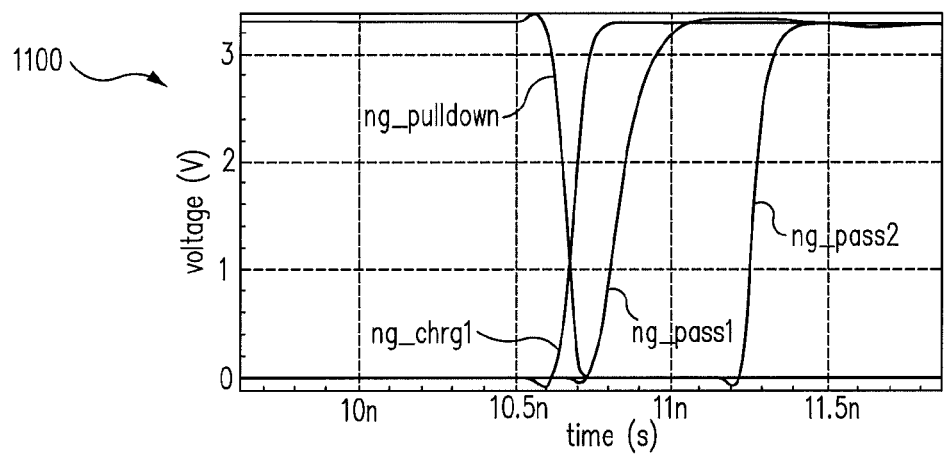
FIGS. 11-13 illustrate waveform plots showing various signals and voltages associated with a high-to-low voltage transition at an output pad in accordance with an embodiment of the invention.
Figure 12:
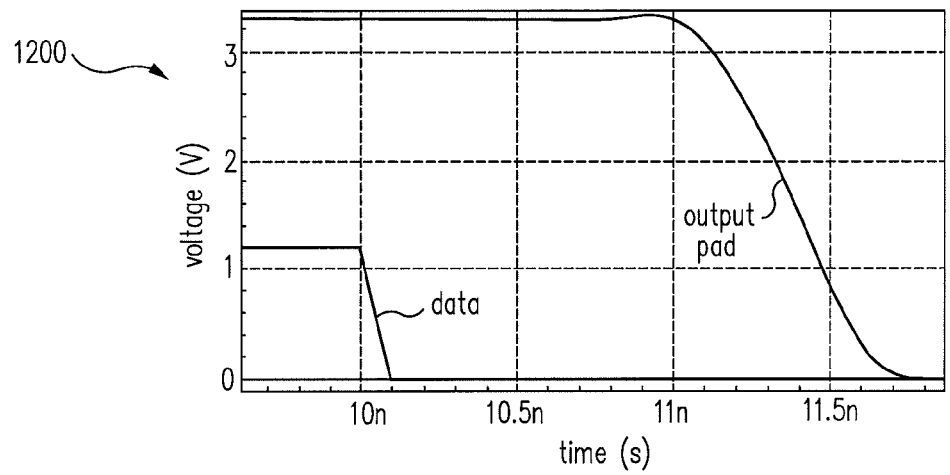
Figure 13:
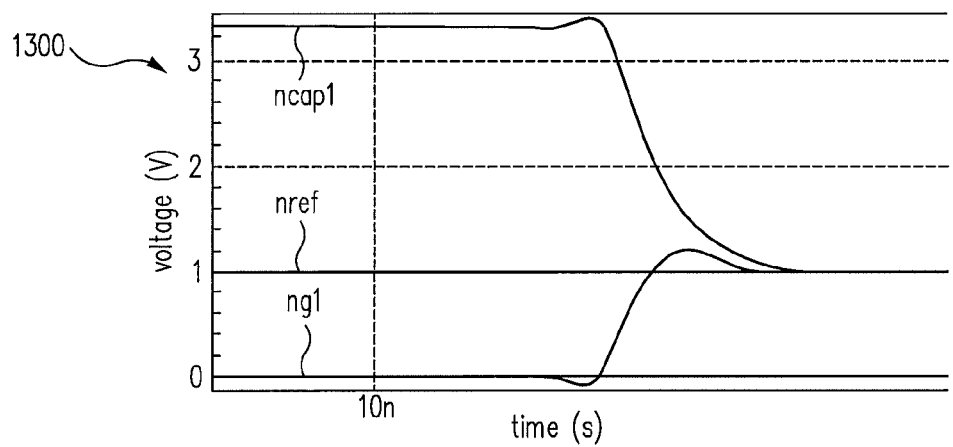

FIGS. 11-13 illustrate waveform plots 1100, 1200, and 1300 showing various signals and voltages associated with a high-to-low voltage transition at output pad 280 in accordance with an embodiment of the invention. For example, FIG. 11 illustrates a waveform plot 1100 showing control signals ng_chrg1, ng_pulldown, ng_pass1, and ng_pass2 used to implement a high-to-low voltage transition at output pad 280. As previously discussed, data timer circuit 400 provides control signals ng_charge, ng_pulldown, ng_pass1, and ng_pass2 to pull-down pre-driver circuit 600 which may be used to implement pull-down pre-driver 240. As also previously discussed, logic 625 of pull-down pre-driver circuit 600 inverts control signal ng_charge to provide control signal ng_chrg1.

FIG. 12 illustrates a waveform plot 1200 showing the data signal provided to data timer circuit 400 and a high-to-low voltage transition of output pad 280. FIG. 13 illustrates a waveform plot 1300 showing voltages of control signal ng1, reference voltage nref, and node 615 (labeled as "ncap1") also during the high-to-low voltage transition of output pad 280.

Each of control signals ng_chrg1, ng_pulldown, pg_pass1, and pg_pass2 are shown in FIG. 11 transitioning between a logic high voltage of approximately 3.25V and a logic low voltage of approximately 0V. These transitions may be performed by data timer circuit 400 in response to the data signal provided to data timer circuit 400 transitioning from a logic high voltage to a logic low voltage.

For example, as shown in FIG. 12, the data signal may transition from a logic high voltage to a logic low voltage approximately at time 10 ns. Prior to the high-to-low transition of the data signal, control signal ng_chrg1 is initially set to a logic low voltage as shown in FIG. 11. During this time (e.g., prior to the high-to-low transition of the data signal), transistor 620 of FIG. 6 will be turned on by control signal ng_chrg1. As a result, node 615 (e.g., ncap1) will be pulled approximately to reference voltage VCCO (implemented in this embodiment as approximately 3.25V) as shown in FIG. 13 to precharge capacitor 610.

Also during this time, control signal ng_pulldown is set to a logic high voltage which causes transistor 630 of FIG. 6 to turn on. As a result, control signal ng1 provided by node 660 is pulled down to a logic low voltage of approximately 0V as shown in FIG. 13. Control signals ng_pass1 and ng_pass2 are also set to logic low voltages during this time which cause transistors 640 and 650, respectively of pull-down pre-driver circuit 600 to turn off. As a result, node 615, capacitor 610, and reference voltage nref will be disconnected from node 660 of pull-down pre-driver circuit 600. Also during this time, reference voltage nref exhibits a voltage of approximately 1.0V as shown in FIG. 13.

Following the transition of the data signal from a logic high voltage to a logic low voltage as shown in FIG. 12, control signals ng_chrg1, ng_pulldown, ng_pass1, and ng_pass2 are switched by data timer circuit 400 and logic 625. Initially, control signal ng_chrg1 transitions from a logic low voltage to a logic high voltage, and control signal ng_pulldown transitions from a logic high voltage to a logic low voltage. As a result, transistor 620 will turn off and no longer operate to precharge node 615 and capacitor 610 approximately to reference voltage VCCO. In addition, transistor 630 will turn off and no longer operate to pull down node 660 and control signal ng1 to a logic low voltage.

Following the switching of control signals ng_chrg1 and ng_pulldown, data timer circuit 400 switches control signal ng_pass1 from a logic low voltage to a logic high voltage. As a result, transistor 640 will turn on and connect node 615 and capacitor 610 to node 660.

Following a time period (for example, approximately 200 ps) after the switching of control signal ng_pass1, data timer circuit 400 switches control signal ng_pass2 from a logic low voltage to a logic high voltage. As a result, transistor 650 will turn on and connect reference voltage nref to node 660.

The effects of the above-described switching of control signals ng_chrg1, ng_pulldown, ng_pass1, and ng_pass2 are shown in waveform plots 1200 and 1300. For example, after the precharging of capacitor 610 and node 615 is interrupted (e.g., in response to control signal ng_chrg1 turning off transistor 620), and node 660 is no longer pulled to a logic low voltage (e.g., in response to control signal ng_pulldown turning off transistor 630), charge will transfer from capacitor 610 to node 660 until the voltage of node 660 equalizes. This causes the voltage at node 615 (e.g., ncap1) to fall and also causes the voltage at node 660 (e.g., control signal ng1) to rise as shown in FIG. 13. Capacitor 610 may be sized so that nodes 615 and 660 settle to a voltage approximately equal to reference voltage nref as shown in FIG. 13. In response to the change in voltage of control signal ng1, transistor 740 of output pad driver circuit 700 will turn on, causing the voltage of output pad 280 to fall as shown in FIG. 12.

It will be appreciated that prior to the switching of control signal ng_pass2 from a logic low voltage to a logic high voltage, reference voltage nref remains disconnected from node 660. In this regard, noise associated with the switching on of transistor 740 can be largely buffered by capacitor 610. As a result, when reference voltage nref is later connected to the gate of transistor 740 (e.g., through node 660 and control signal ng1), reference voltage nref is disturbed very little as shown in FIG. 13.

It will be appreciated that subcircuits 680 and 690 of pull-down pre-driver circuit 600 may be operated in a similar manner as described above in order to buffer reference voltage nref from noise disturbances associated with transistors 750 and 760, respectively.

Figure 14:
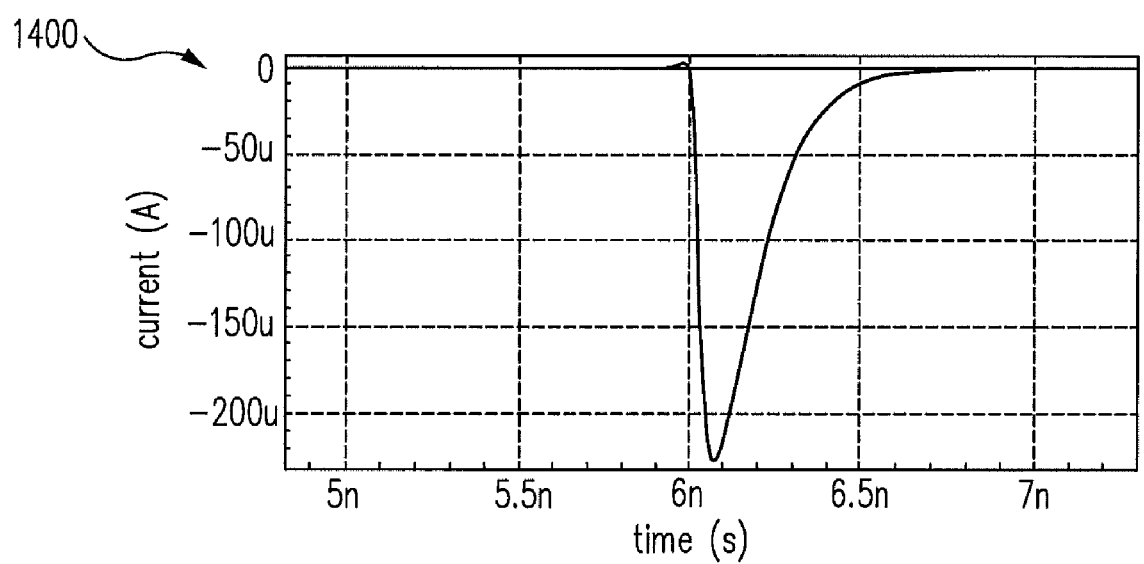
FIG. 14 illustrates a waveform plot showing current flowing into a capacitor in accordance with an embodiment of the invention.

FIG. 14 illustrates a waveform plot 1400 showing current flowing into capacitor 610 as it is precharged in accordance with an embodiment of the invention. In this example, capacitor 610 is sized to connect to the gate of a driver transistor that has been implemented to satisfy the LVCMOS 33-20 mA specification. As shown in FIG. 14, current flows into capacitor 610 over a period of approximately 600 ps and reaches a maximum current of approximately 220 μA. It will be appreciated that this corresponds approximately to the current previously described herein with regard to capacitors 160 and 170 of buffer system 100. Capacitor 510 may be implemented in a similar manner and exhibit a current flow of similar magnitude when precharged.

Advantageously, the current shown in FIG. 14 is significantly smaller than the current required by prior buffering techniques. For example, by way of comparison, prior source-follower buffers implemented with power save circuits may draw approximately 2 mA over a period of approximately 4 ns each time an output pad toggles.

Although particular embodiments of the invention have been described herein, additional embodiments are also contemplated. For example, in one embodiment, the slew rate of output pad 280 may be adjusted higher by implementing a low resistance connection between capacitor 510 and the gate of transistor 710 to create a fast slew rate where charge quickly transfers from capacitor 510 to the driver gate. Conversely, a high resistance connection between capacitor 510 and the gate of transistor 710 may be used to create a slow slew rate condition where the charge transfer occurs more slowly. The speed of the charge transfer affects how quickly the gate voltage of transistor 710 changes and therefore affects how quickly transistor 710 turns on which controls the slew rate of output pad 280. Similar changes can be made to one or more of subcircuits 580 and 590 of FIG. 5 and subcircuits 670, 680, and 690 FIG. 6 if desired in particular embodiments. Advantageously, such slew rate adjustments may be made without increasing the bias current traditionally used to perform such control for circuits employing source-follower or unity gain buffers.

As another example, although only a single capacitor 510 is connected to node 515 in the embodiment illustrated in FIG. 5, additional capacitors may selectively connected to node 515 (for example, through appropriate switches) in other embodiments to further tune the operation of buffer system 200. In this regard, such additional capacitors may be switched in or out to fine tune the voltage at which the driver transistor gates settle (for example, gates of transistors 710-760). Advantageously, such capacitors may be used to compensate for reference variations due to process, temperature, voltage supply levels, or other factors. Such capacitors may also be used to provide pre-emphasis or additional drive current prior to connecting reference voltages to gates of driver transistors. Similar changes can be made to one or more of subcircuits 580 and 590 of FIG. 5 and subcircuits 670, 680, and 690 FIG. 6 if desired in particular embodiments.

In one embodiment, the various circuits described herein may be implemented using 65 nm CMOS technology. Alternatively, other implementations and/or other CMOS sizes may be used.

In view of the present disclosure, it will be appreciated that a buffer system implemented in accordance with various embodiments described herein may consume less current than prior buffering techniques. In addition, because of the short control signal switching times described herein, propagation delays between a data signal received by the buffer signal and voltage changes at an output pad can also be reduced. A buffer system as described in the embodiments set forth herein may also require less layout area than prior buffer systems. For example, in one embodiment, a buffer system as described herein may occupy an area of approximately 450 to 570 square microns.

Embodiments described above illustrate but do not limit the invention. It should also be understood that numerous modifications and variations are possible in accordance with the principles of the present invention. Accordingly, the scope of the invention is defined only by the following claims.

We claim:
1. An output driver buffer circuit comprising:
   a first output driver transistor adapted to adjust an output voltage of an output pad; and
   a first pre-driver circuit connected to a gate of the first output driver transistor and adapted to receive a first reference voltage to control the first output driver transistor, wherein the first pre-driver circuit comprises:
      a first capacitor adapted to be precharged to a first voltage,
      a first switch adapted to connect the first capacitor to the gate of the first output driver transistor, and
      a second switch adapted to connect the first reference voltage to the gate of the first output driver transistor following a first time period after the first capacitor is connected to the gate of the first output driver transistor, wherein the first capacitor is adapted to buffer noise associated with the first output driver transistor during the first time period.
2. The output driver buffer circuit of claim 1, wherein the first and second switches are adapted to operate in response to first and second control signals, respectively.
3. The output driver buffer circuit of claim 2, wherein the first and second control signals are adapted to switch in response to a voltage change in a data signal.
4. The output driver buffer circuit of claim 1, wherein the first capacitor is a transistor.
5. The output driver buffer circuit of claim 1, wherein the first pre-driver circuit further comprises a third switch adapted to disconnect the first capacitor from the first voltage before the first capacitor is connected to the gate of the first output driver transistor.
6. The output driver buffer circuit of claim 1, wherein the first pre-driver circuit further comprises a fourth switch adapted to disable the first output driver transistor before the first capacitor is connected to the gate of the first output driver transistor.
7. The output driver buffer circuit of claim 1, wherein the first time period is approximately 200 ps.
8. A programmable logic device (PLD) comprising the buffered output driver circuit of claim 1.
9. The output driver buffer circuit of claim 1, wherein:
   the first output driver transistor is adapted to selectively pull up the output voltage of the output pad; and
   the buffered output driver circuit further comprises:
      a second output driver transistor adapted to selectively pull down the output voltage of the output pad, and
      a second pre-driver circuit connected to a gate of the second output driver transistor and adapted to receive a second reference voltage to control the second output driver transistor, wherein the second pre-driver circuit comprises:
         a second capacitor adapted to be precharged to a second voltage,
         a fifth switch adapted to connect the second capacitor to the gate of the second output driver transistor, and
         a sixth switch adapted to connect the second reference voltage to the gate of the second output driver transistor following a second time period after the second capacitor is connected to the gate of the second output driver transistor, wherein the second capacitor is adapted to buffer noise associated with the second output driver transistor during the second time period.
10. A method of adjusting an output voltage of an output pad, the method comprising:

receiving a data signal;

precharging a first capacitor to a first voltage;

in response to the data signal transitioning from a first value to a second value, connecting the first capacitor to a gate of a first output driver transistor connected to the output pad; and connecting a first reference voltage to the gate of the first output driver transistor following a first time period after the first capacitor is connected to the gate of the first output driver transistor, wherein the first capacitor is adapted to buffer noise associated with the first output driver transistor during the first time period.

11. The method of claim 10, wherein the first and second connecting steps are performed in response to first and second control signals, respectively.

12. The method of claim 11, wherein the first and second control signals are adapted to switch in response to a voltage change in a data signal.

13. The method of claim 10, wherein the first capacitor is a transistor.

14. The method of claim 10, further comprising disconnecting the first capacitor from the first voltage before the first connecting step.

15. The method of claim 10, further comprising disabling disable the first output driver transistor before the first connecting step.

16. The method of claim 10, wherein the first time period is approximately 200 ps.

17. The method of claim 10, wherein the method is performed by a buffered output driver circuit of a programmable logic device (PLD).

18. The method of claim 10, wherein:

the first output driver transistor is adapted to selectively pull up the output voltage of the output pad; and the method further comprises:

precharging a second capacitor to a second voltage, in response to the data signal transitioning from the second value to the first value, connecting the second capacitor to a gate of a second output driver transistor connected to the output pad, wherein the second output driver transistor is adapted to selectively pull down the output voltage of the output pad, and connecting a second reference voltage to the gate of the second output driver transistor following a second time period after the second capacitor is connected to the gate of the second output driver transistor, wherein the second capacitor is adapted to buffer noise associated with the second output driver transistor during the second time period.

19. An output driver buffer circuit comprising:

a first means for adjusting an output voltage of an output pad;

a first means for buffering noise associated with the first adjusting means;

a first means for connecting the first buffering means to the first adjusting means; and a first means for connecting a first reference voltage to the first adjusting means following a first time period after the first buffering means is connected to the first adjusting means.

20. The output driver buffer circuit of claim 19, wherein:

the first adjusting means is adapted to selectively pull up the output voltage of the output pad; and the buffered output driver circuit further comprises:

a second means for adjusting the output voltage of the output pad, wherein the second adjusting means is adapted to selectively pull down the output voltage of the output pad, a second means for buffering noise associated with the second adjusting means, a second means for connecting the second buffering means to the second adjusting means, and a second means for connecting a second reference voltage to the second adjusting means following a second time period after the second buffering means is connected to the second adjusting means.

* * * * *